(12) United States Patent
Kweon

(10) Patent No.: US 6,638,775 B1
(45) Date of Patent: Oct. 28, 2003

(54) METHOD FOR FABRICATING SEMICONDUCTOR MEMORY DEVICE

(75) Inventor: Soon-Yong Kweon, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 10/316,831

(22) Filed: Dec. 12, 2002

(30) Foreign Application Priority Data

Apr. 26, 2002 (KR) ........................................ 2002-23041

(51) Int. Cl.$^7$ ................................................ H01G 7/06
(52) U.S. Cl. ........................... 438/3; 438/253; 438/629; 438/672
(58) Field of Search .............................. 438/3, 238–240, 438/253–256, 381, 396–399, 627–629, 672, 675

(56) References Cited

U.S. PATENT DOCUMENTS 6,388,281 B1    5/2002   Jung et al.
6,420,267 B1    7/2002   Lin et al.
6,500,678 B1 *  12/2002  Aggarwal et al. ............. 438/3

* cited by examiner

Primary Examiner—Jey Tsai
(74) Attorney, Agent, or Firm—Jacobson Holman PLLC

(57) ABSTRACT

The present invention provides a method including the steps of: forming a first diffusion barrier on an insulating layer and in a contact hole; forming a conductive layer on the first diffusion barrier; forming a conductive plug in the contact hole by removing the conductive layer thereby obtaining a first recess in the contact hole, wherein the first recess is surrounded by the conductive layer in the contact hole; etching the first diffusion barrier on the insulating layer thereby forming a second recess in the contact hole, wherein a portion of the conductive plug is surrounded by the second recess and the second recess is surrounded by the insulating layer; removing the portion of the conductive plug surrounded by the second recess thereby forming a third recess in the contact hole, wherein the third recess is surrounded by the insulating layer and bottom of the of the third recess expose the first diffusion barrier and the conductive plug in the contact hole; and forming a second diffusion barrier in the third recess.

15 Claims, 11 Drawing Sheets

METHOD FOR FABRICATING SEMICONDUCTOR MEMORY DEVICE

FIELD OF THE INVENTION

The present invention relates to semiconductor memory devices, and more particularly, to a method for fabricating semiconductor memory devices having a conductive plug connected to a capacitor.

DESCRIPTION OF THE PRIOR ART

In a semiconductor memory device, several studies have been developed to overcome the limits of refresh in a conventional dynamic random access memory (DRAM) and to achieve large capacitance by using a ferroelectric material in a capacitor. A ferroelectric random access memory (hereinafter, referred to a FeRAM) is one of the nonvolatile memory devices that can store information in turn-off state and has an operating speed comparable to that of the conventional DRAM.

Ferroelectric material having a perovskite structure or a Bi-layered perovskite structure, such as $(Bi, La)_4Ti_3O_{12}$ (hereinafter, referred to as a BLT), $SrBi_2Ta_2O_9$ (hereinafter, referred to as an SBT) or $Pb(Zr, Ti)O_3$ (hereinafter, referred to as a PZT) is usually used to form a dielectric layer of a capacitor in a FeRAM device. The ferroelectric layer, which is employed in a nonvolatile memory device, has a dielectric constant in a range of a few hundreds to a few thousands, and has two stabilized remnant polarization(Pr) states.

The ferroelectric capacitor is connected to a silicon substrate, that is, to one junction of a transistor, through a plug in order to increase the, integration density. The plug had been formed of polysilicon. However, in case of using polysilicon, the contact resistance between the plug and the silicon substrate is increased because of the native oxide formed on the surface of the silicon substrate. Therefore, tungsten is used for forming a plug in order to overcome the demerits of polysilicon.

The lower electrode of the ferroelectric capacitor is made of $Pt/IrO_x/Ir$ on a tungsten plug for the purpose of reducing the leakage current, preventing the diffusion of oxygen and mutual diffusion of materials in upper and lower layers. The symbol "/", as used herein, defines a layering of films, so that $Pt/IrO_x/Ir$ is a stacked layers in which a Pt layer is formed at the top and a Ir layer is formed at the bottom.

It is necessary to perform a high temperature thermal treatment in an ambient of oxygen for improving the characteristics of the ferroelectric layer. Therefore, it is important to maintain the stability of the bottom electrode having the stacked layer structure and to prevent the oxidation of plug during the high temperature thermal treatment for improving the reliability of the FeRAM.

The Ir layer formed at the bottom of the lower electrode has a poor adhesion with an interlayer insulating layer, such as silicon oxide, formed beneath the Ir layer. Therefore, a glue layer should be introduced between the Ir layer and the interlayer insulating layer. The glue layer is generally formed with insulator, such as $Al_2O_3$, and thus, the portion of glue layer covering the plug should be etched selectively with an additional mask.

In addition, it is generated that the problem of mutual diffusion between the tungsten plug and the Ir layer in the lower electrode having the stacked layer structure, when the high temperature thermal treatment is preformed after forming the ferroelectric capacitor on the tungsten plug, as mentioned above. In order to prevent the mutual diffusion between the tungsten plug and the Ir layer, a buried barrier structure is introduced. The buried barrier 58A structure is composed of a diffusion barrier, such as TiN or TiAlN, in a contact hole to cover the plug.

An etch process is performed to remove a portion of a tungsten layer formed in a contact hole, in order to provide a space for the buried barrier structure. However, a residue of the tungsten layer is left on sidewalls of the contact hole after the etch process. Therefore, the thermal stability of FeRAM is deteriorated by the residue.

FIGS. 1A to 1F are cross-sectional views illustrating the manufacturing method of the FeRAM according to a prior art.

Referring to FIG. 1A, the interlayer insulating layer 12 is formed over a semiconductor substrate 10 on which a field oxide layer 11 and $n^+$ junctions 13 are formed, and the interlayer insulating layer 12 is selectively etched to form a contact hole exposing the $n^+$ junctions 13. The semiconductor substrate 10 is a silicon layer, such as a doped polysilicon layer or a silicon layer formed by an epitaxial growth.

A Ti layer and a TiN layer is made in this order to form a TiN/Ti layer 14, and a rapid thermal process(RTP) is performed to form a titanium silicide layer 14A by inducing the reaction of silicon atoms in the semiconductor substrate 10 and the TiN/Ti layer. 14. The titanium silicide layer 14A plays a role of the ohmic contact layer. After the RTP, a TiN layer can be formed to stabilize the titanium silicide layer 14A. Thereafter, a tungsten layer 15 is formed on the TiN/Ti layer 14 to fill the contact hole, completely.

Referring to FIG. 1B, an etch process is performed to form a tungsten plug 15A in the contact hole and to expose the surface of the TiN/Ti layer 14 on the interlayer insulating layer 12. The tungsten plug 15A is over etched by a predetermined depth with the etch process, in order to make space for a diffusion barrier in the contact hole. However, the center of the tungsten plug 15A is mainly etched, therefore, a recess R is generated. Namely, the tungsten on the portion of TiN/Ti layer 14 covering sidewalls of the entrance of the contact hole is left without being etched to induce deteriorating characteristic of FeRAM.

Referring to FIG. 1C, a TiN diffusion barrier 16 is formed on the tungsten plug 15A in the contact hole and the TiN/Ti layer 14.

Referring to FIG. 1D, the TiN diffusion barrier 16 and the TiN/Ti layer 14 are polished by the chemical-mechanical polishing (CMP) until the surface of the interlayer insulating layer 12 is exposed, therefore a buried TiN diffusion barrier 16A is formed in the contact hole.

As shown in FIG. 1D, the tungsten plug 15A, is not covered with the buried TiN diffusion barrier 16A completely, because the TiN diffusion barrier 16A is formed only in the recess R. Therefore, a portion of the tungsten plug 15A, that is the residue of tungsten on the TiN/Ti layer 14 covering the sidewalls of the entrance of the contact hole, is exposed.

Referring to FIG. 1E, the glue layer 17 is formed on the interlayer insulating layer 12 surrounding the contact hole. It is needed to selectively etch the glue layer 17 to expose the TiN diffusion barrier 16A, in case of forming the glue layer 17 with insulator. The glue layer 17 is formed to improve the adhesion between the interlayer insulating layer 12 and a Ir layer to be formed on the interlayer insulating layer 12.

The tungsten plug 15A and the TiN diffusion barrier 16A are exposed and damaged during the process for selectively etching the glue layer 12. In addition, the problem of the lateral oxidation of the plug is generated in case of exposing the plug during the process for selectively etching the glue layer 12. The possibility of the lateral oxidation is increased as the integration of device is increased.

Referring to FIG. 1F, a stacked layer comprising Pt layer 20/IrO$_x$ layer 19/Ir layer 18 is formed on the TiN diffusion barrier 16A and the glue layer 17 to form the lower electrode. Then, a ferroelectric layer 21 is formed on the lower electrode and an upper electrode 22 is subsequently formed on the ferroelectric layer 21.

The TiN diffusion barrier 16A is formed to prevent mutual diffusion between the Ir layer 18 of the lower electrode and the tungsten plug 15A. However, the exposed portion of the tungsten plug 15A, that is residue of the tungsten, denoted as 'A' in FIG. 1E, on sidewalls of entrance of the contact hole is directly contacted with the Ir layer 18. Accordingly, it is impossible to prevent the mutual diffusion between the Ir layer 18 of the lower electrode completely, and the tungsten plug 15A can be oxidized during thermal treatments.

SUMMARY OF THE INVENTION

It is, therefore, an object of the present invention to provide a semiconductor memory device manufacturing method capable of preventing direct contact between a plug and a lower electrode of a capacitor.

It is, therefore, another object of the present invention to provide a semiconductor memory device manufacturing method capable of preventing the generation of the problems caused by the misalign of mask for forming a glue layer pattern between an interlayer insulating layer and the lower electrode.

In accordance with an aspect of the present invention, there is provided a method for manufacturing a semiconductor memory device, comprising the steps of: forming an insulating layer on a semiconductor substrate; forming a contact hole exposing the semiconductor substrate by selectively etching the insulating layer; forming a first diffusion barrier on the insulating layer and in the contact hole; forming a conductive layer on the first diffusion barrier; forming a conductive plug in the contact hole by removing the conductive layer until the first diffusion barrier on the insulating layer is exposed, thereby obtaining a first recess in the contact hole, wherein the first recess is surrounded by the conductive layer in the contact hole; etching the first diffusion barrier on the insulating layer thereby forming a second recess in the contact hole, wherein a portion of the conductive plug is surrounded by the second recess and the second recess is surrounded by the insulating layer; removing the portion of the conductive plug surrounded by the second recess thereby forming a third recess in the contact hole, wherein the third recess is surrounded by the insulating layer and bottom of the of the third recess expose the first diffusion barrier and the conductive plug in the contact hole; and forming a second diffusion barrier in the third recess.

In accordance with another aspect of the present invention, there is provided a method for manufacturing a semiconductor memory device, comprising the steps of: forming an insulating layer on a semiconductor substrate; forming an adhesion layer on the insulating layer; forming a capping layer on the adhesion layer; forming a contact hole exposing the semiconductor substrate by selectively etching the capping layer, the adhesion layer and the insulating layer; forming a first diffusion barrier on the capping layer and in the contact hole; forming a conductive layer on the first diffusion barrier; forming a conductive plug in the contact hole by removing the conductive layer until the first diffusion barrier on the insulating layer is exposed, thereby obtaining a first recess in the contact hole, wherein the first recess is surrounded by the conductive layer in the contact hole; etching the first diffusion barrier on the capping layer thereby forming a second recess in the contact hole, wherein a portion of the conductive plug is surrounded by the second recess and the second recess is surrounded by the capping layer, adhesion layer and the insulating layer; removing the portion of the conductive plug surrounded by the second recess thereby forming a third recess in the contact hole, wherein the third recess is surrounded by the capping layer, adhesion layer and the insulating layer and bottom of the third recess expose the first diffusion barrier and the conductive plug in the contact hole; and forming a second diffusion barrier in the third recess and removing the capping layer on the adhesion layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENT

Hereinafter, a semiconductor memory device manufacturing method in accordance with the present invention will be described in detail referring to the accompanying drawings.

FIGS. 2A to 2G are cross-sectional views illustrating the FeRAM manufacturing method in accordance with a first embodiment of the present invention.

Figure 1A:
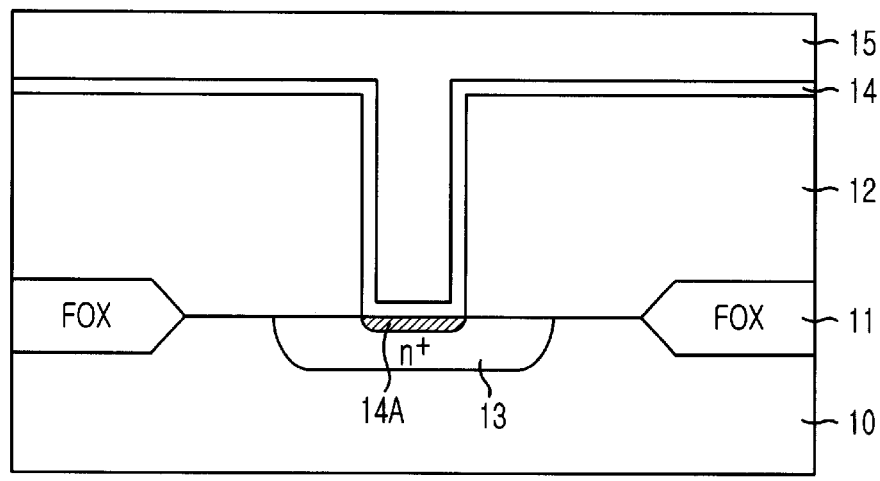
FIGS. 1A to 1F are cross-sectional views illustrating FeRAM manufacturing method according to a prior art.
Figure 1B:
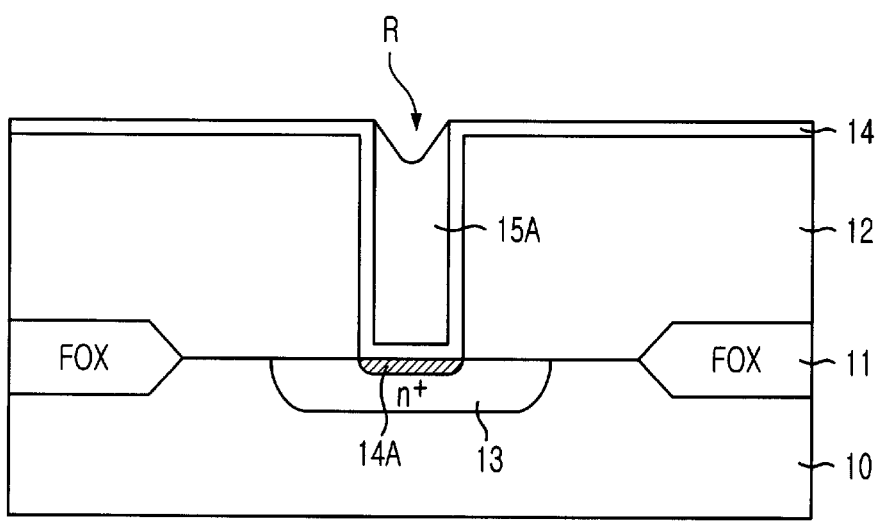
Figure 1C:
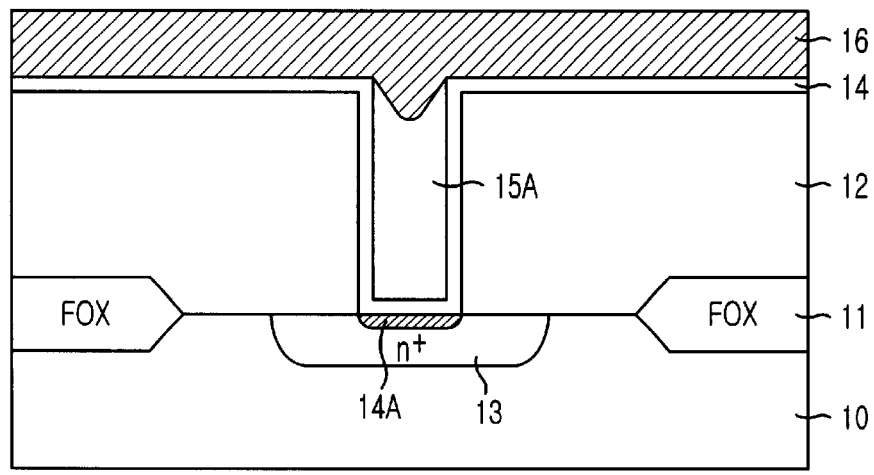
Figure 1D:
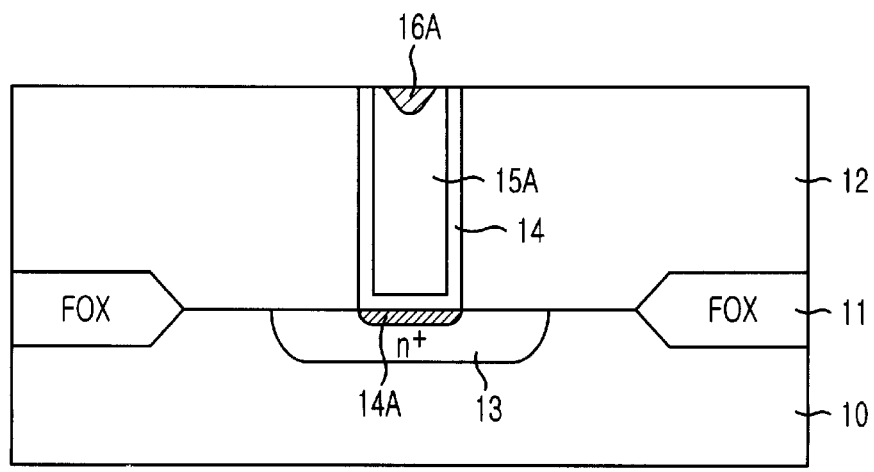
Figure 1E:
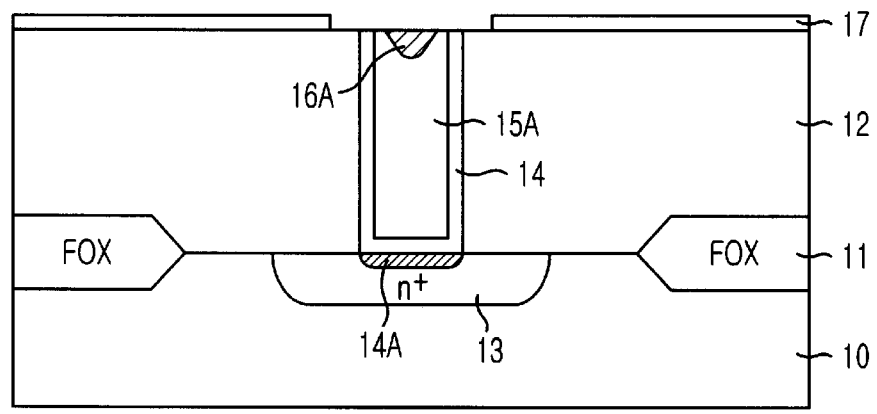
Figure 1F:
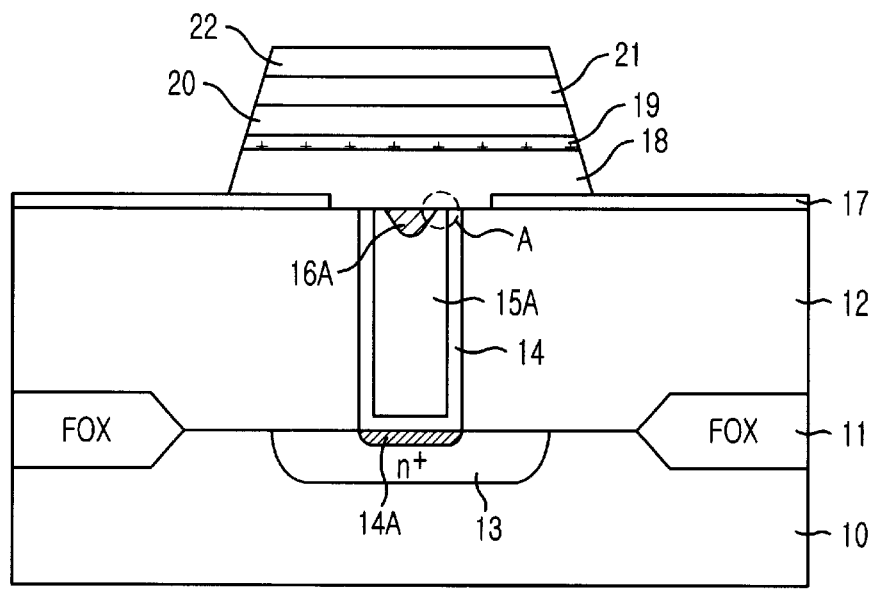
Figure 2A:
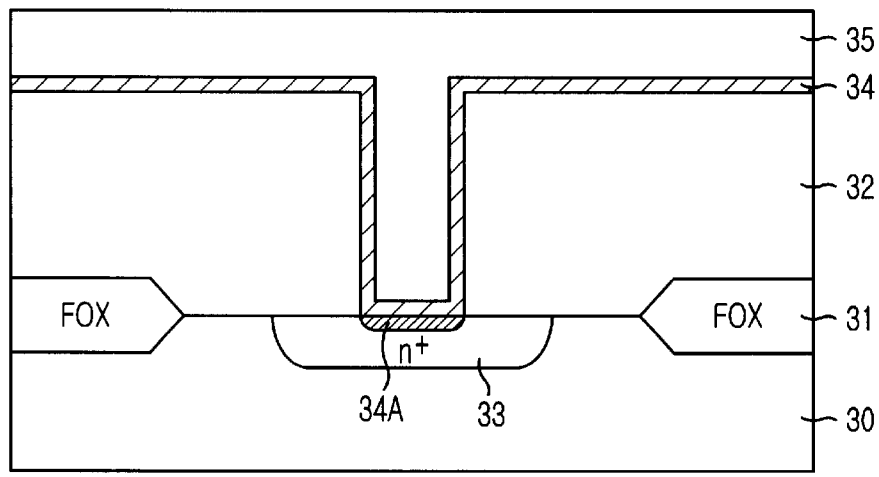
FIGS. 2A to 2G are cross-sectional views illustrating the FeRAM manufacturing method in accordance with a first embodiment of the present invention.

Referring to FIG. 2A, the interlayer insulating layer 32 is formed over a semiconductor substrate 30 on which a field oxide layer 31 and n$^+$ junctions 33 are formed, and the interlayer insulating layer 32 is selectively etched to form a contact hole exposing the n$^+$ junctions 33. The semiconductor substrate 30 is a silicon layer, such as a doped polysilicon layer or a silicon layer formed by an epitaxial growth.

A first diffusion barrier is formed on the interlayer insulating layer 32 in the contact hole. In the preferred embodiment of the present invention, a TiN/Ti diffusion barrier 34 is formed as the first diffusion barrier by stacking Ti layer and a TiN layer in this order. A rapid thermal process(RTP) is performed to form a titanium silicide layer 34A by inducing the reaction of silicon atoms in the semiconductor substrate 30 and the TiN/Ti layer 34. The titanium silicide layer 34A plays a role of the ohmic contact layer.

The TiN/Ti layer 34 is formed with a chemical vapor deposition(CVD), an atomic layer deposition(ALD) or an electro-chemical deposition(ECD). The Ti layer is formed to a thickness ranging from about 10 Å to about 200 Å, and the TiN layer is formed to a thickness ranging from about 50 Å to about 500 Å. The RTP is performed in an ambient of Ar or N$_2$ at a temperature ranging from about 600° C. to about 1000° C. for about 1 second to about 10 minutes.

After the RTP, a TiN layer can be formed to stabilize the titanium silicide layer 34A to a thickness ranging from about 50 Å to about 500 Å.

Thereafter, a tungsten layer 15 is formed on the TiN/Ti layer 34 to fill the contact hole, completely. The tungsten layer 35 is formed to a thickness ranging from about 500 Å to about 5000 Å with a CVD, an ALD or an ECD. The thickness of the tungsten layer 35 depends on the size of the contact hole. For example, the tungsten layer 35 is formed to about 3000 Å for a contact hole of which diameter is 0.30 μm.

A thermal treatment, such as a furnace thermal treatment or the RTP can be performed to improve the characteristic of the tungsten layer 15 in the contact hole. The thermal treatment performed at a temperature ranging from about 200° C. to about 600° C. in an ambient of Ar, $N_2$ or the combination thereof.

Figure 2B:
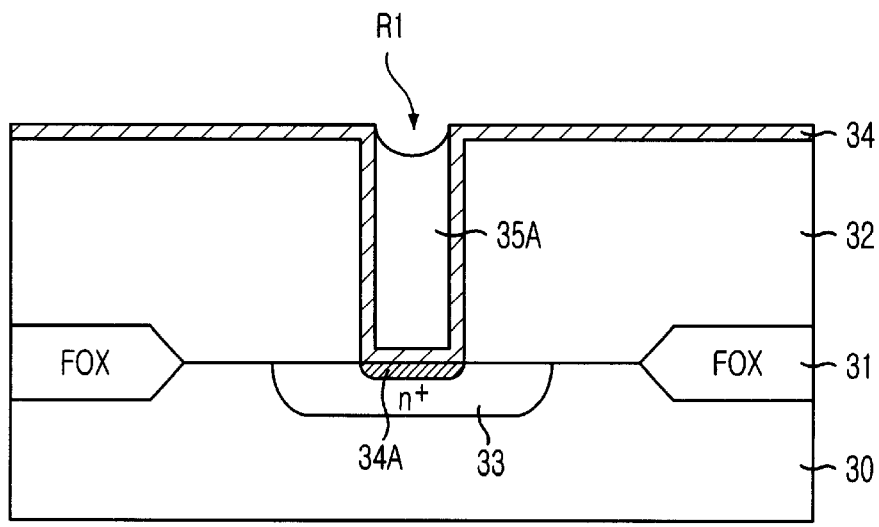

Referring to FIG. 2B, a first etch process is performed to form a tungsten plug 35A in the contact hole until the surface of the TiN/Ti layer 34 is exposed. The tungsten plug 35A is over etched by a predetermined depth with the first etch process, in order to make space for a second diffusion barrier in the contact hole. A first recess R1 is formed at the center of the tungsten plug 35A.

Figure 2C:
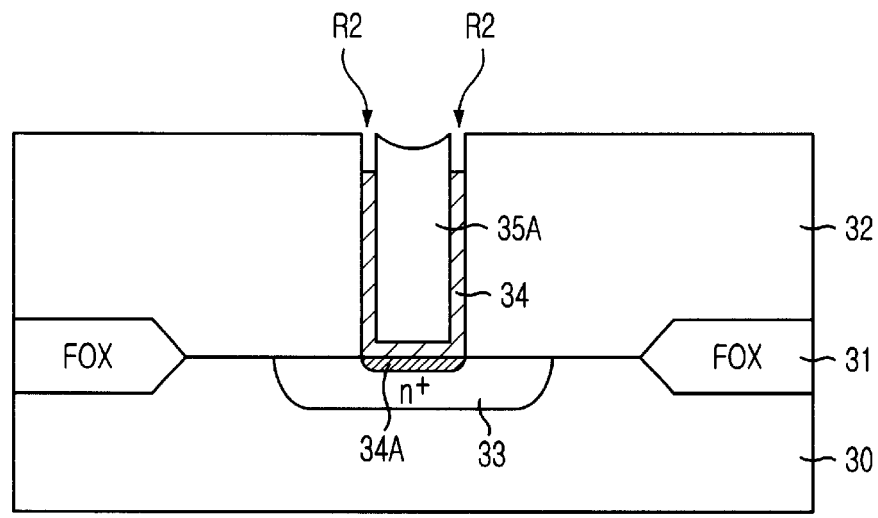

Referring to FIG. 2C, a second etch process is performed until the surface of the interlayer insulating layer 32 is exposed. Thus, the TiN/Ti layer 34 formed on the interlayer insulating layer 32 is removed and a second recess R2 is formed between the tungsten plug 35A and the sidewall of the interlayer insulating layer 32. The second recess R2 is formed to a depth ranging from about 500 Å to about 3000 Å. The second etch process can be performed with an wet etch process using the SC-1 solution, formed by mixing $NH_4OH$, $H_2O_2$, and $H_2O$ in a rate of $NH_4OH: H_2O_2: H_2O=1:4:20$.

Figure 2D:
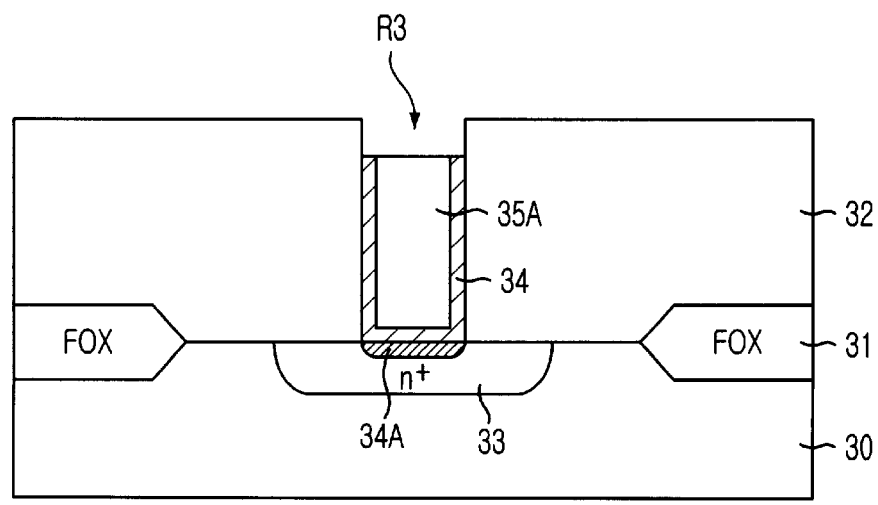

Referring to FIG. 2D, a third etch process is performed to remove the portion of the tungsten plug 35A surrounded by the second recess R2, thus a third recess R3 is formed in the contact hole to a depth ranging from about 500 Å to about 3000 Å. The interlayer insulating layer 32 is exposed at the sidewall of the third recess R3, and the surfaces of the TiN/Ti layer 34 and the tungsten plug 35A are exposed at the bottom of the third recess R3. By forming the buried barrier in the third recess R3, tungsten or the portion of the tungsten plug 35A is not exposed at the entrance of the contact hole. Accordingly, it is possible to prevent the tungsten or the portion of the tungsten plug 35A being directly contacted with a lower electrode of a ferroelectric capacitor.

Figure 2E:
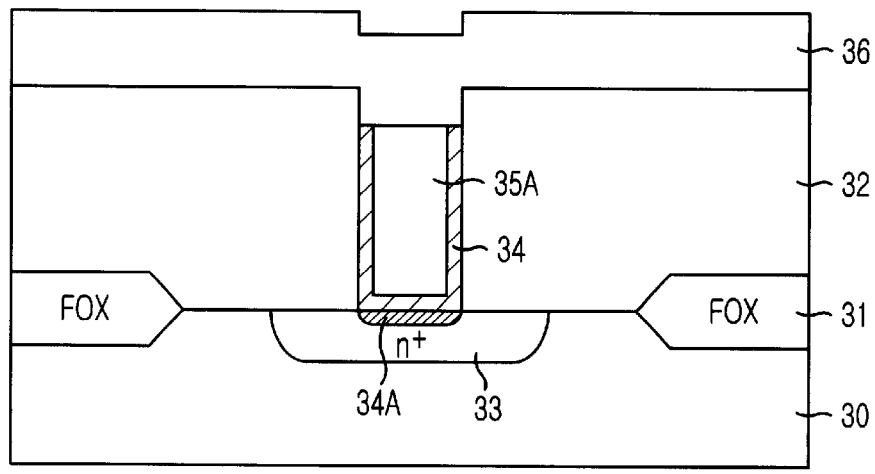

Referring to FIG. 2E, a second diffusion barrier 36 is formed on the interlayer insulating layer 32 and in the third recess R3.

Figure 2F:
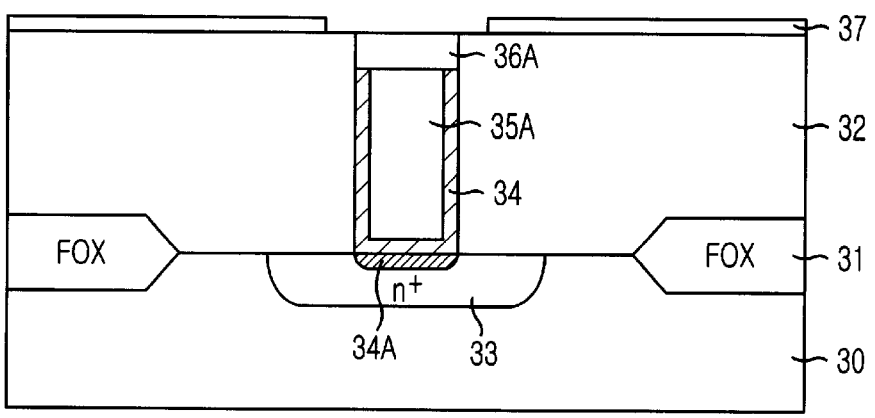

Referring to FIG. 2F, the second diffusion barrier 36 is polished by the chemical-mechanical polishing (CMP) until the surface of the interlayer insulating layer 32 is exposed. Therefore, a buried diffusion barrier 36A is formed in the contact hole, namely in the third recess R3. The second diffusion barrier 36 is formed with TiN, TaN, WN, TiAlN, TiSiN, TaAlN, TaSiN, RuTiN, RuTiO or CrTiN.

A thermal treatment or a plasma treatment can be performed to improve the characteristic of the buried diffusion barrier 36A. For the thermal treatment, the furnace thermal treatment or the RTP is adopted. The furnace thermal treatment is performed in an: ambient of $N_2$, $O_2$, Ar or the combinations thereof at a temperature ranging from about 200° C. to about 500° C. for from about 5 minutes to about 2 hours. The RTP is performed in an ambient of $N_2$, $O_2$, Ar or the combinations thereof at a temperature ranging from about 200° C. to about 500° C. for from about 1 seconds to about 10 minutes. In addition, the buried diffusion barrier 36A can be undergone plasma generated in an ambient of $O_2$, $N_2$, $N_2O$, $NH_3$ or $O_3$.

Thereafter, the glue layer 37 is formed on the interlayer insulating layer 12 surrounding the contact hole. The glue layer 37 is formed to improve the adhesion between the interlayer insulating layer 32 and a Ir layer to be formed on the interlayer insulating layer 32. It is need to selectively etch the glue layer 37 to expose the buried diffusion barrier 36A, in case of forming the glue layer 37 with insulator. In the preferred embodiment of the present invention the glue layer 37 is formed of $Al_2O_3$. A dry or an wet etch can be performed to etch the glue layer 37. In case of the wet etch a HF solution or a buffered oxide etchant(BOE) is used.

A thermal treatment or a plasma treatment can be performed to improve the adhesion and the oxygen diffusion barrier characteristics. For the thermal treatment, the furnace thermal treatment or the RTP is adopted. The furnace thermal treatment is performed in an ambient of $N_2$, $O_2$, Ar or the combinations thereof at a temperature ranging from about 400° C. to about 800° C. for from about 5 minutes to about 2 hours. The RTP is performed in an ambient of $N_2$, $O_2$, Ar or the combinations thereof at a temperature ranging from about 400° C. to about 800° C. for from about 1 second to about 10 minutes. In addition, the buried diffusion barrier 36A can be undergone plasma generated in an ambient of $O_2$, $N_2$, $N_2O$, $NH_3$ or $O_3$.

Figure 2G:
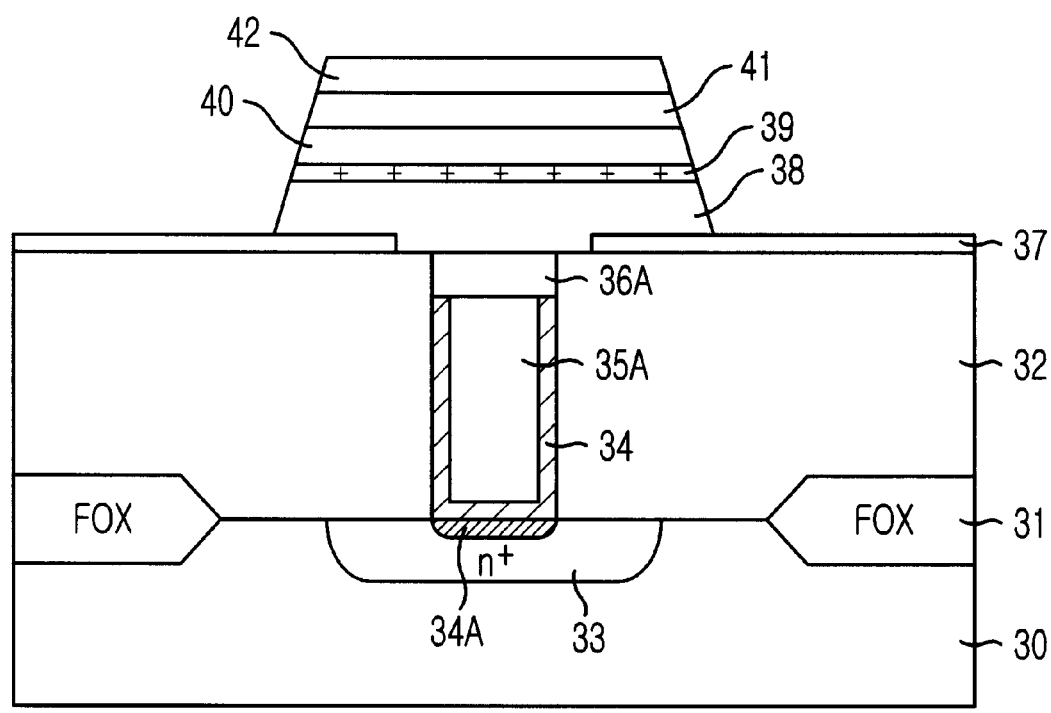

Referring to FIG. 2G, a stacked layer comprising Pt layer 40/$IrO_x$ layer 39/Ir layer 38 is formed on the buried diffusion barrier 36A and the glue layer 17 to form the lower electrode. The Ir layer 38 at the bottom of the lower electrode plays a role of preventing the diffusion of oxygen, and the $IrO_x$ layer 39 plays a role of preventing the diffusion of mutual diffusion of materials in upper and lower layers.

The stacked layer, Pt layer 40/$IrO_x$ layer 39/Ir layer 38, is formed with a physical vapor deposition(PVD), a CVD or an ALD. The Pt layer 40 is formed to a thickness ranging from about 100 Å to about 2000 Å, the $IrO_x$ layer 39 is formed to a thickness ranging from about 10 Å to about 1000 Å and the Ir layer 38 is formed to a thickness ranging from about 100 Å to about 2000 Å. The lower electrode can be formed of a Pt/RuTiN stacked layer, a Pt/RuTiO stacked layer or a Pt/CrTiN stacked layer.

After forming the lower electrode, a thermal treatment or a plasma treatment can be performed to prevent the oxidation of the lower electrode. For the thermal treatment, the furnace thermal treatment or the RTP is adopted. The furnace thermal treatment is performed in an ambient of $N_2$, $O_2$, Ar or the combinations thereof at a temperature ranging from about 200° C. to about 800° C. for from about 5 minutes to about 2 hours. The RTP is performed in an ambient of $N_2$, $O_2$, Ar or the combinations thereof at a temperature ranging from about 400° C. to about 800° C. for from about 1 second to about 10 minutes.

Then, a ferroelectric layer 41 is formed on the lower electrode and an upper electrode 42 is subsequently formed on the ferroelectric layer 41. The ferroelectric layer 41 is formed of $(Bi, La)_4Ti_3O_{12}$(BLT), $SrBi_2Ta_2O_9$(SBT), $SrBi_2(Ta,Nb)_2O_9$(SBTN), $Pb(Zr,Ti)O_3$(PZT) using a spin on method, a CVD, an ALD or a PVD to a thickness ranging from about 50 to about 2000 Å. After forming the ferroelectric layer 41, a thermal treatment or a plasma treatment can be performed to improve the characteristic of the ferroelectric layer 41, at a temperature ranging from about 400°

C. to about 800° C. in an ambient of $O_2$, $N_2$, Ar, $O_3$, He, Ne, Kr or the combinations thereof for from about 10 minutes to about 5 hours. The thermal treatment is performed with a diffusion furnace method, the RTP or the combination thereof.

The upper electrode 42 is formed of metal like Pt, Ir or Ru, nitride metal like TiN, TaN or WN, or conductive oxide like $IrO_x$, $RuO_x$, La—Sr—Co—O(LSCO) or Y—Ba—Co—O (YBCO). The upper electrode is formed with a PVD, a CVD or an ALD at a temperature ranging from about 50° C. to about 600° C. to a thickness ranging from about 100 Å to about 2000 Å.

After forming the upper electrode, a thermal treatment can be performed to increase the density of the upper electrode with the furnace thermal treatment or the RTP. The furnace thermal treatment is performed in an ambient of $N_2$, $O_2$, Ar or the combinations thereof at a temperature ranging from about 400° C. to about 800° C. for from about 5 minutes to about 2 hours. The RTP is performed in an ambient of $N_2$, $O_2$, Ar or the combinations thereof at a temperature ranging from about 400° C. to about 800° C. for from about 1 second to about 10 minutes.

In the FeRAM fabricated with the method in accordance with the first embodiment, of the present invention, the plug and bottom electrode is not directly contacted to each other. Therefore, it is possible to prevent the oxidation of the plug.

However, during the process for selectively etching the glue layer 37, the buried diffusion barrier 36A can be exposed and damaged, and thus, the selective etching the glue layer is apt to cause a lateral oxidation of the plug.

The above mentioned problem generated during the selective etching of the glue layer can be overcome by the following the second embodiment of the present invention.

FIGS. 3A to 3H are cross-sectional views illustrating the FeRAM manufacturing method in accordance with the second embodiment of the present invention.

Figure 3A:
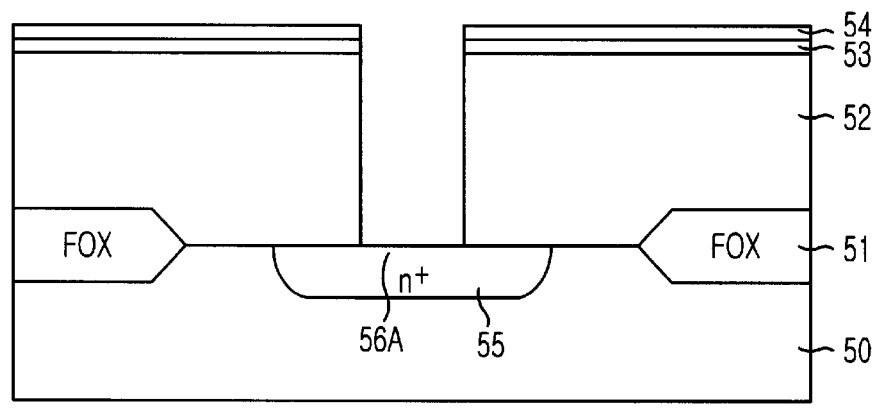
FIGS. 3A to 3H are cross-sectional views illustrating the FeRAM manufacturing method in accordance with a second embodiment of the present invention.

Referring to FIG. 3A, the interlayer insulating layer 52, an glue layer 53 and a capping oxide layer 54 are formed in this order over a semiconductor substrate 50 on which a field oxide layer 51 and n$^+$ junctions 55 are formed, and the interlayer insulating layer 52, the glue layer 53 and the capping oxide layer 54 are selectively etched to form a contact hole exposing the n$^+$ junctions 55. The glue layer 53 is formed of $Al_2O_3$ with an ALD, a CVD, or a PVD. The glue layer 53 is formed to a thickness ranging from about 10 Å to about 500 Å.

After forming the glue layer 53, a thermal treatment or a plasma treatment can be performed to improve the characteristics of adhesion and a diffusion barrier to oxygen.

For the thermal treatment, the furnace thermal treatment or the RTP is adopted. The furnace thermal treatment is performed in an ambient of $N_2$, $O_2$, Ar or the combinations thereof at a temperature ranging from about 400° C. to about 800° C. for from about 5 minutes to about 2 hours. The RTP is performed in an ambient of $N_2$, $O_2$, Ar or the combinations thereof at a temperature ranging from about 400° C. to about 800° C. for from about 1 second to about 10 minutes. The plasma treatment is performed in an ambient of $O_2$, $N_2$, $N_2O$, $NH_3$ or $O_3$.

The capping oxide layer. 54 is formed of SiOx, SION, $Si_3N_4$, $ZrO_2$ or $HfO_2$ with a CVD, a PVD, an ALD or spin-on method. The capping oxide layer 54 is formed to a thickness ranging from about 10 Å to about 1000 Å.

After forming the capping oxide layer 54, a thermal treatment or a plasma treatment can be performed to improve the characteristics of the capping oxide layer 54. Each condition of thermal treatment or the plasma treatment is same with the thermal treatment or the plasma treatment applied to the glue layer 53.

As mentioned above, the glue layer 53 is selectively etched during the process for forming the contact hole. Therefore, it is no needed to etch the glue layer after forming a plug in the contact hole. The capping oxide layer 54 plays a role of an etch barrier, and the capping oxide layer 54 is to be removed when a CMP is performed to form a buried barrier in the contact hole.

Figure 3B:
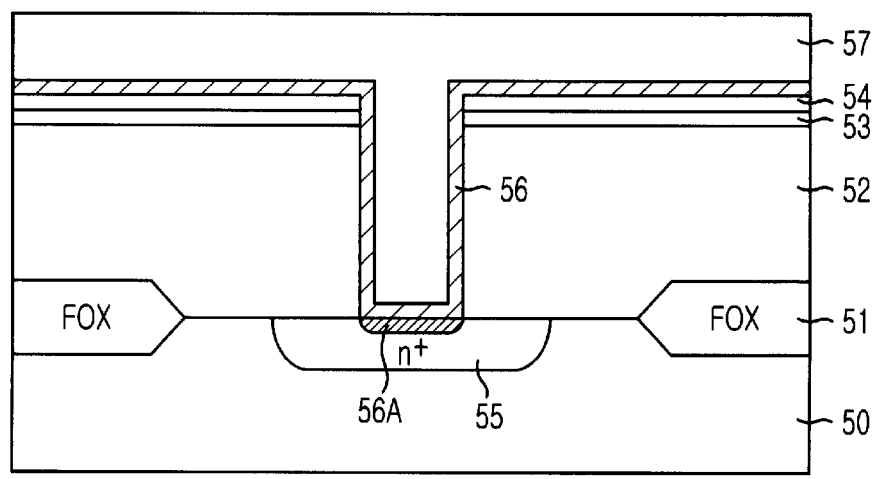

Referring to FIG. 3B, a first diffusion barrier is formed on the capping oxide layer and on the interlayer insulating layer 52 exposed on sidewalls of the contact hole. In the preferred embodiment of the present invention, a TiN/Ti layer 56 is formed as the first diffusion barrier by stacking a Ti layer and a TiN layer in this order. A rapid thermal process(RTP) is performed to form a titanium silicide layer 36A by inducing the reaction of silicon atoms in the semiconductor substrate 50 and the TiN/Ti layer 56. The titanium silicide layer 56A plays a role of the ohmic contact layer.

The TiN/Ti layer 34 is formed with a CVD, an ALD or an ECD. The Ti layer is formed to a thickness ranging from about 10 Å to about 200 Å, and the TiN layer is formed to a thickness ranging from about 50 Å to about 500 Å.

The RTP is performed in an ambient of Ar or $N_2$ at a temperature ranging from about 60° C. to about 1000° C. for about 1 second to about 10 minutes.

After the RTP, a TiN layer can be formed to stabilize the titanium silicide layer 56A to a thickness ranging from about 50 Å to about 500 Å.

Thereafter, a tungsten layer 57 is formed on the TiN/Ti layer 54 to fill the contact hole, completely. The tungsten layer 57 is formed toga thickness ranging from about 500 Å to about 5000 Å with a CVD, an ALD or an ECD. The thickness of the tungsten layer 57 depends on the size of the contact hole. For example, the tungsten layer 57 is formed to about 3000 Å for contact hole of which diameter is 0.30 μm.

A thermal treatment, such as a furnace thermal treatment or the RTP can be performed to improve the characteristic of a plug. The thermal treatment performed at a temperature ranging from about 200° C. to about 600° C. in an ambient of Ar, $N_2$ or the combination thereof.

Figure 3C:
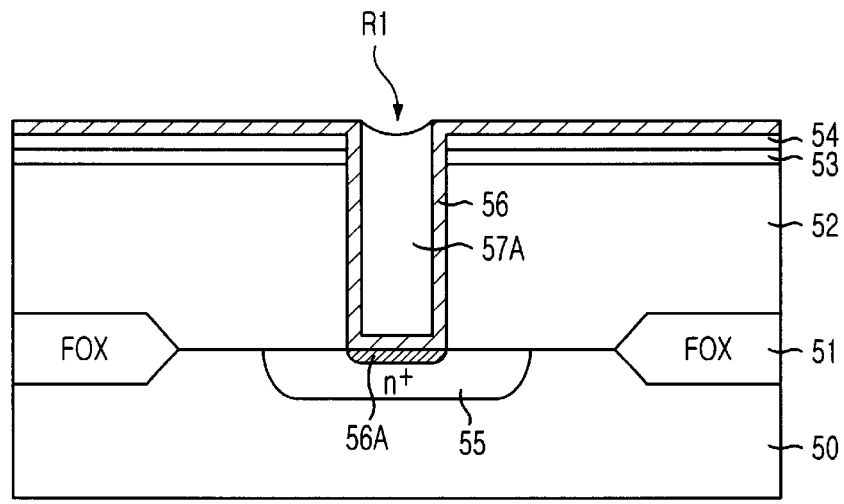

Referring to FIG. 3C, a first etch process is performed to form a tungsten plug 57A in the contact hole until the surface of the TiN/Ti layer 54 is exposed. The tungsten plug 57A is over etched by a predetermined depth with the first etch process, in order to make space for a second diffusion barrier in the contact hole, and thus a first recess R1 is formed at the center of the tungsten plug 57A.

Figure 3D:
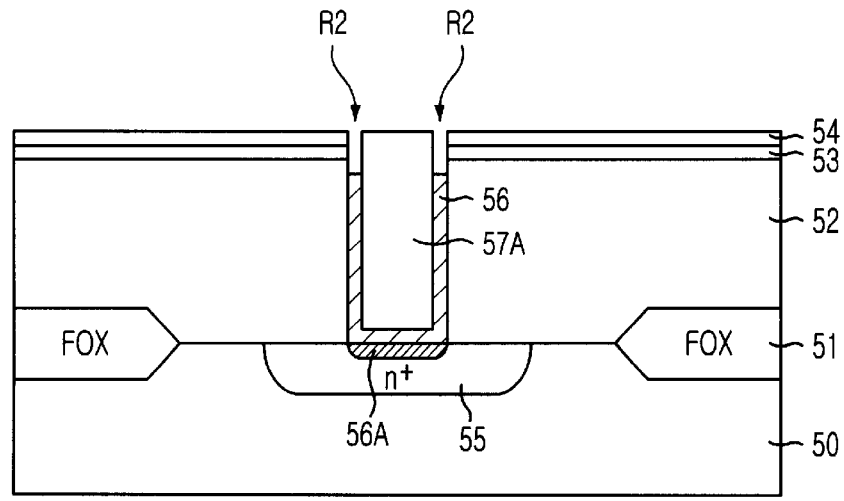

Referring to FIG. 3D, a second etch process is performed until the surface of the capping oxide layer 53 is exposed, and thus the TiN/Ti layer 34 on sidewall of the interlayer insulating layer 52 is removed and a second recess R2 is formed between the tungsten plug 57A and the sidewall of the interlayer insulating layer 52. The second recess R2 is formed to a depth ranging from about 500 Å to about 3000 Å.

The second etch process can be performed with an wet etch using the SC-1 solution, formed by mixing $NH_4OH$, $H_2O_2$, and $H_2O$ at a rate of $NH_4OH$: $H_2O_2$: $H_2O$=1:4:20.

Figure 3E:
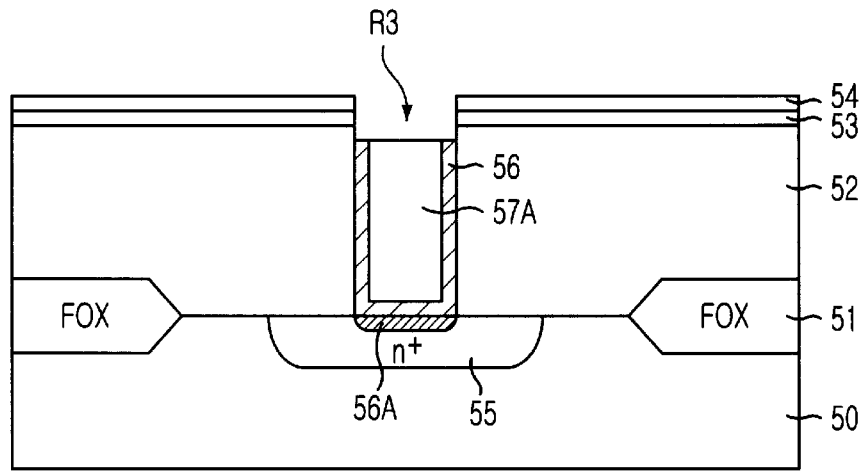

Referring to FIG. 3E, a third etch process is performed to remove the portion of the tungsten plug 57A surrounded by the second recess R2, thus a third recess R3 is formed in the contact hole to a depth ranging from about 500 Å to about 3000 Å. The interlayer insulating layer 52 is exposed at the sidewall of the third recess R3, and the surfaces of the TIN/Ti layer 54 and the tungsten plug 57A are exposed at the bottom of the third recess R3. By forming the third recess R3, tungsten or the portion of the tungsten plug 57A is not exposed at the entrance of the contact hole. Accordingly, it is possible to prevent the tungsten or the portion of the tungsten plug 57A being directly contacted with a lower electrode of a ferroelectric capacitor.

Figure 3F:
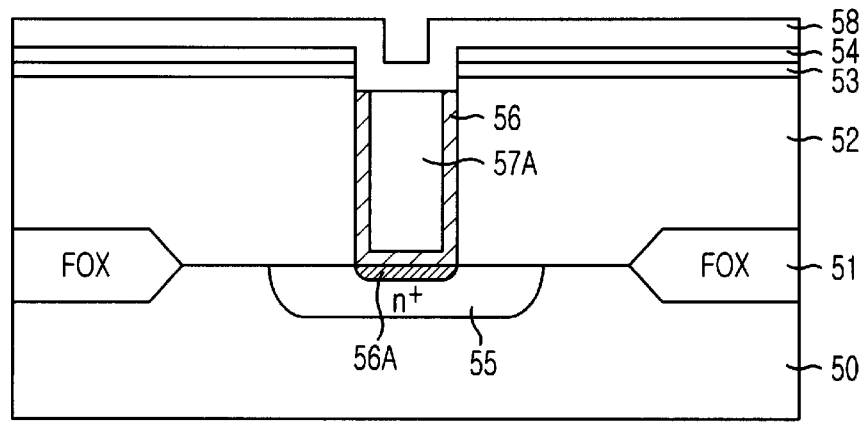

Referring to FIG. 3F, a second diffusion barrier 58 is formed on the TiN/Ti layer 54 and in the third recess R3. The second diffusion barrier 58 is formed with TiN, TaN, WN, TiAlN, TiSiN, TaAlN, TaSiN, RuTiN, RuTiO or CrTiN.

Figure 3G:
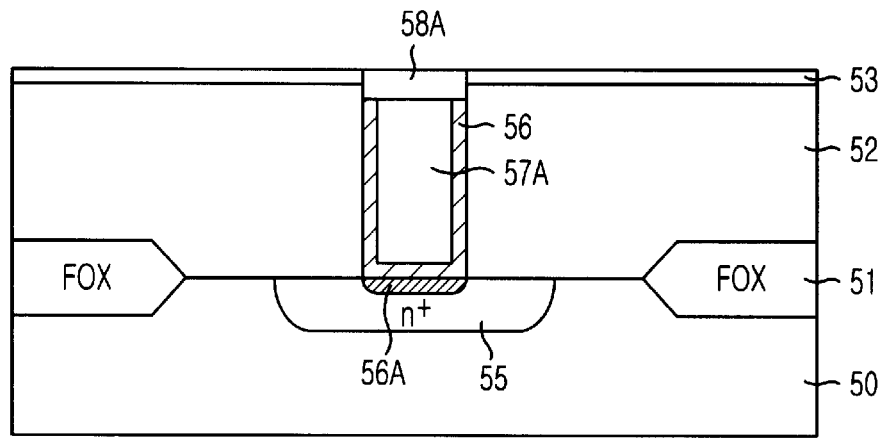

Referring to FIG. 3G, the second diffusion barrier 58 and the capping oxide layer 54 are polished by the CMP until the surface of the glue layer 53 is exposed. Therefore, a buried diffusion barrier 58A is formed in the contact hole, namely in the third recess R3. During the CMP, the damage of the glue layer is not generated even if the capping oxide layer is removed completely, because the second diffusion barrier 58 has high selectivity to the glue layer. For example, in case of forming the second diffusion barrier and the glue layer with TiN and $Al_2O_3$, respectively, the selectivity of TiN to $Al_2O_3$ is 100 to 1.

By forming the buried barrier in the third recess R3, tungsten or the portion of the tungsten plug 57A is not exposed at the entrance of the contact hole. Accordingly, it is possible to prevent the tungsten or the portion of the tungsten plug 57A being directly contacted with a lower electrode of a ferroelectric capacitor.

A thermal treatment or a plasma treatment can be performed to improve the characteristic of the buried diffusion barrier 58A. For the thermal treatment, the furnace thermal treatment or the RTP is adopted. The furnace thermal treatment is performed in an ambient of $N_2$, $O_2$, Ar or the combinations thereof at a temperature ranging from about 200° C. to about 500° C. for from about 5 minutes to about 2 hours. The RTP is performed in an ambient of $N_2$, $O_2$, Ar or the combinations thereof at a temperature ranging from about 200° C. to about 500° C. for from about 1 second to about 10 minutes. In addition, the buried diffusion barrier 58A can be undergone plasma generated in an ambient of $O_2$, $N_2$, $N_2O$, $NH_3$ or $O_3$.

Figure 3H:
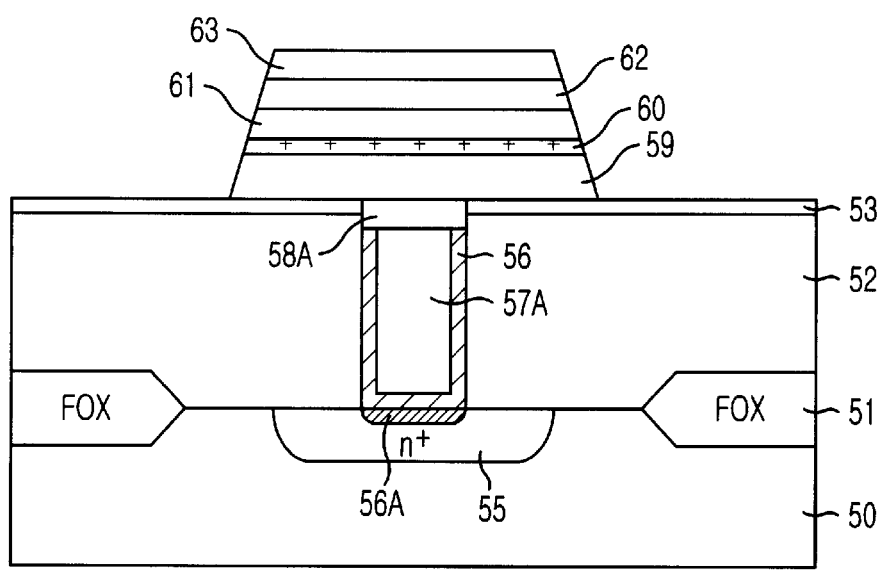

Referring to FIG. 3H, a stacked layer comprising Pt layer 61/$IrO_x$ layer 60/Ir layer 59 is formed on the buried diffusion barrier 58A and the glue layer 53 to form the lower electrode. The Ir layer 59 at the bottom of the lower electrode plays a role of preventing the diffusion of oxygen, and the $IrO_x$ layer 60 plays a role of preventing the diffusion of mutual diffusion of materials in upper and lower layers.

The stacked layer, Pt layer 61/$IrO_x$ layer 60/Ir layer 59, is formed with a PVD method, a CVD or an ALD. The Pt layer 60 is formed to a thickness ranging from about 100 Å to about 2000 Å. The $IrO_x$ layer 60 is formed to a thickness ranging from about 10 Å to about 1000 Å and the Ir layer 59 is formed to a thickness ranging from about 100 Å to about 2000 Å. The lower electrode can be formed of a Pt/RuTiN stacked layer, a Pt/RuTiO stacked layer or a Pt/CrTiN stacked layer.

After forming the lower electrode, a thermal treatment or a plasma treatment can be performed to prevent the oxidation of the lower electrode. For the thermal treatment, the furnace thermal treatment or the RTP is adopted. The furnace thermal treatment is performed in an ambient of $N_2$, $O_2$, Ar or the combinations thereof at a temperature ranging from about 200° C. to about 800° C. for from about 5 minutes to about 2 hours. The RTP is performed in an ambient of $N_2$, $O_2$, Ar or the combinations thereof at a temperature ranging from about 400° C. to about 800° C. for from about 1 second to about 10 minutes.

Then, a ferroelectric layer 62 is formed on the lower electrode and an upper electrode 63 is subsequently formed on the ferroelectric layer 62.

The ferroelectric layer 62 is formed of $(Bi,La)_4Ti_3O_{12}$ (BLT), $SrBi_2Ta_2O_9$(SBT), $SrBi_2(Ta,Nb)_2O_9$(SBTN), $Pb(Zr,Ti)O_3$(PZT) using a spin on method, a CVD, an ALD or a PVD to a thickness ranging from about 50 to about 2000 Å. After forming the ferroelectric layer 62, a thermal treatment or a plasma treatment can be performed to improve the characteristic of the ferroelectric layer 62, at a temperature ranging from about 400° C. to about 800° C. in an ambient of $O_2$, $N_2$, Ar, $O_3$, He, Ne, Kr or the combinations thereof for from about 10 minutes to about 5 hours. The thermal treatment is performed with a diffusion furnace method, the RTP or the combination thereof.

The upper electrode 63 is formed of metal like Pt, Ir or Ru, nitride metal like TiN, TaN or WN, or conductive oxide like $IrO_x$, $RuO_x$, La—Sr—Co—O(LSCO) or Y—Ba—Co—O (YBCO). The upper electrode is formed with the PVD method, a CVD or an ALD method at a temperature ranging from about 50° C. to about 600° C. to a thickness ranging from about 100 Å to about 2000 Å.

After forming the upper electrode, a thermal treatment can be performed to increase the density of the upper electrode with the furnace thermal treatment or the RTP. The furnace thermal treatment is performed in an ambient of $N_2$, $O_2$, Ar or the combinations thereof at a temperature ranging from about 400° C. to about 800° C. for from about 5 minutes to about 2 hours. The RTP is performed in an ambient of $N_2$, $O_2$, Ar or the combinations thereof at a temperature ranging from about 400° C. to about 800° C. for from about 1 second to about 10 minutes.

In the FeRAM fabricated; with the method in accordance with the second embodiment of the present invention, the plug and bottom electrode is not directly contacted to each other. Therefore, it is possible to prevent the oxidation of the plug. In addition, the glue layer is selectively etched during the formation of the contact hole. Therefore, it is possible to prevent the buried diffusion barrier 58A from being exposed and damaged, and thus, the lateral oxidation of the plug caused by the selective etching the glue layer can be prevented.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor memory device, comprising the steps of:

forming an insulating layer on a semiconductor substrate;

forming a contact hole exposing the semiconductor substrate by selectively etching the insulating layer;

forming a first diffusion barrier on the insulating layer and in the contact hole;

forming a conductive layer on the first diffusion barrier;

forming a conductive plug in the contact hole by removing the conductive layer until the first diffusion barrier on the insulating layer is exposed, thereby obtaining a first recess in the contact hole, wherein the first recess is surrounded by the conductive layer in the contact hole;

etching the first diffusion barrier on the insulating layer thereby forming a second recess in the contact hole, wherein a portion of the conductive plug is surrounded by the second recess and the second recess is surrounded by the insulating layer;

removing the portion of the conductive plug surrounded by the second recess thereby forming a third recess in the contact hole, wherein the third recess is surrounded by the insulating layer and bottom of the of the third recess expose the first diffusion barrier and the conductive plug in the contact hole; and forming a second diffusion barrier in the third recess.

2. The method of claim 1, further comprising the step of forming a capacitor connected to the second diffusion barrier.

3. The method of claim 1, further comprising the step of forming an adhesion layer on the insulating after forming the second diffusion barrier.

4. The method of claim 1, wherein the conductive layer is formed with tungsten.

5. The method of claim 2, wherein the second diffusion barrier is formed with any one selected from a group consisting of TiN, TaN, WN, TiAlN, TiSiN, TaAlN, TaSiN, RuTiN, RuTiO and CrTiN.

6. The method of claim 5, wherein the capacitor includes a ferroelectrice layer.

7. The method of claim 6, wherein the capacitor includes a lower electrode formed with Ir.

8. A method for manufacturing a semiconductor memory device, comprising the steps of:

forming an insulating layer on a semiconductor substrate;

forming an adhesion layer on the insulating layer;

forming a capping layer on the adhesion layer;

forming a contact hole exposing the semiconductor substrate by selectively etching the capping layer, the adhesion layer and the insulating layer;

forming a first diffusion barrier on the capping layer and in the contact hole;

forming a conductive layer on the first diffusion barrier;

forming a conductive plug in the contact hole by removing the conductive layer until the first diffusion barrier on the insulating layer is exposed, thereby obtaining a first recess in the contact hole, wherein the first recess is surrounded by the conductive layer in the contact hole;

etching the first diffusion barrier on the capping layer thereby forming a second recess in the contact hole, wherein a portion of the conductive plug is surrounded by the second recess and the second recess is surrounded by the capping layer, adhesion layer and the insulating layer;

removing the portion of the conductive plug surrounded by the second recess thereby forming a third recess in the contact hole, wherein the third recess is surrounded by the capping layer, adhesion layer and the insulating layer and bottom of the of the third recess expose the first diffusion barrier and the conductive plug in the contact hole; and forming a second diffusion barrier in the third recess and removing the capping layer on the adhesion layer.

9. The method of claim 8, further comprising the step of forming a capacitor connected to the second diffusion barrier.

10. The method of claim 8, further comprising the step of forming an adhesion layer on the insulating after forming the second diffusion barrier.

11. The method of claim 8, wherein the conductive layer is formed with tungsten.

12. The method of claim 11, wherein the second diffusion barrier is formed with any one selected from a group consisting of TiN, TaN, WN, TiAlN, TiSiN, TaAlN, TaSiN, RuTiN, RuTiO and CrTiN.

13. The method of claim 12, wherein the capacitor includes a ferroelectrice layer.

14. The method of claim 13, wherein the capacitor includes a lower electrode formed with Ir.

15. The method of claim 8, wherein the capping layer is formed with oxide.

* * * * *